US009543931B2

(12) United States Patent
Chen (10) Patent No.: US 9,543,931 B2
(45) Date of Patent: Jan. 10, 2017

(54) LOW-VOLTAGE TO HIGH-VOLTAGE LEVEL SHIFTER CIRCUIT (71) Applicant: SEMICONDUCTOR MANUFACTURING INTERNATIONAL (SHANGHAI) CORPORATION, Shanghai (CN)

(72) Inventor: Jie Chen, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/881,078

(22) Filed: Oct. 12, 2015

(65) Prior Publication Data

US 2016/0105163 A1 Apr. 14, 2016

(30) Foreign Application Priority Data

Oct. 11, 2014 (CN) .......................... 2014 1 0534857

(51) Int. Cl.
H03L 5/00 (2006.01)
H03K 3/356 (2006.01)
(52) U.S. Cl.
CPC .............................. H03K 3/356165 (2013.01)
(58) Field of Classification Search
None
See application file for complete search history.

(56) References Cited

U.S. PATENT DOCUMENTS

| 6,998,879 B2* | 2/2006 | Kajimoto | H04L 25/061 327/73 |
|---|---|---|---|
| 7,675,323 B2* | 3/2010 | Murata | H03F 3/45183 326/82 |
| 7,956,651 B2* | 6/2011 | Ptacek | H03K 5/249 327/307 |
| 2006/0061386 A1* | 3/2006 | Kanzaki | H03K 19/01852 326/81 |
| 2013/0181762 A1* | 7/2013 | Wu | H03K 3/35613 327/333 |
| 2014/0035672 A1* | 2/2014 | Ahmad | H03L 5/00 330/260 |
| 2014/0320168 A1* | 10/2014 | Luo | H03K 19/0013 326/80 |

(Continued)

Primary Examiner — Lincoln Donovan
Assistant Examiner — Khareem E Almo
(74) Attorney, Agent, or Firm — Kilpatrick Townsend and Stockton LLP (57) ABSTRACT A low-voltage to high-voltage level shifter circuit includes an input circuit, a voltage shifting circuit, and an output circuit. The input circuit is configured to receive an input signal having a voltage range between a first voltage and a ground voltage, and to provide an inverted input signal and a delayed version of the inverted input signal. The voltage shifting circuit is coupled to the input circuit and is configured to receive the input signal, the inverted input signal, and the delayed version of the inverted input signal. The voltage shifting circuit is configured to provide an internal signal having a voltage range between a second voltage and the ground voltage, the second voltage being higher than the first voltage. The output circuit provides an output voltage in the high-voltage range for the corresponding input voltage in the low-voltage range.

20 Claims, 4 Drawing Sheets

(56) References Cited

U.S. PATENT DOCUMENTS

| | | | |
|---|---|---|---|
| 2014/0368254 A1* | 12/2014 | Lee | H03K 17/165 327/378 |
| 2015/0288365 A1* | 10/2015 | Lai | G11C 16/14 327/333 |
| 2016/0105163 A1* | 4/2016 | Chen | H03K 3/356165 327/333 |
| 2016/0118985 A1* | 4/2016 | Zhou | H03K 3/356165 326/80 |
| 2016/0126909 A1* | 5/2016 | Vashishtha | H03K 5/2481 330/260 |

* cited by examiner

LOW-VOLTAGE TO HIGH-VOLTAGE LEVEL SHIFTER CIRCUIT

CROSS-REFERENCES TO RELATED APPLICATIONS

This application claims priority to Chinese patent application No. 201410534857.1, filed on Oct. 11, 2014, the content of which is incorporated herein by reference in its entirety.

BACKGROUND OF THE INVENTION

The present invention relates to the field of electronic circuit technology; in particular it relates to a low-voltage to high-voltage level shifter circuit.

To achieve high performance and high integration density, transistor dimensions are aggressively scaled down in the ultra-deep submicron process and nanometer process, while low power dissipation is achieved by scaling down the supply voltage even under 0.7 V or 0.9V. In various electronic devices, integrated circuits operating at low supply voltages are interfaced with electronic circuits operating at higher supply voltages. For example, a chip set operating at a first core voltage level (VDDL) can interface with a memory device operating at a higher voltage level (VDDH), for example, at 1.4 V. In addition, many kinds of I/O voltages such as 1.5V, 1.8V, 2.5V and 3.3V are needed in the I/O interface part.

A conventional voltage converter circuit is often used as a bridge for connecting low-voltage circuits and high-voltage circuits. For example, a voltage shifter circuit can be used to connect a low-voltage core logic to a high-voltage I/O interface circuit to obtain a higher drive current.

Figure 1:
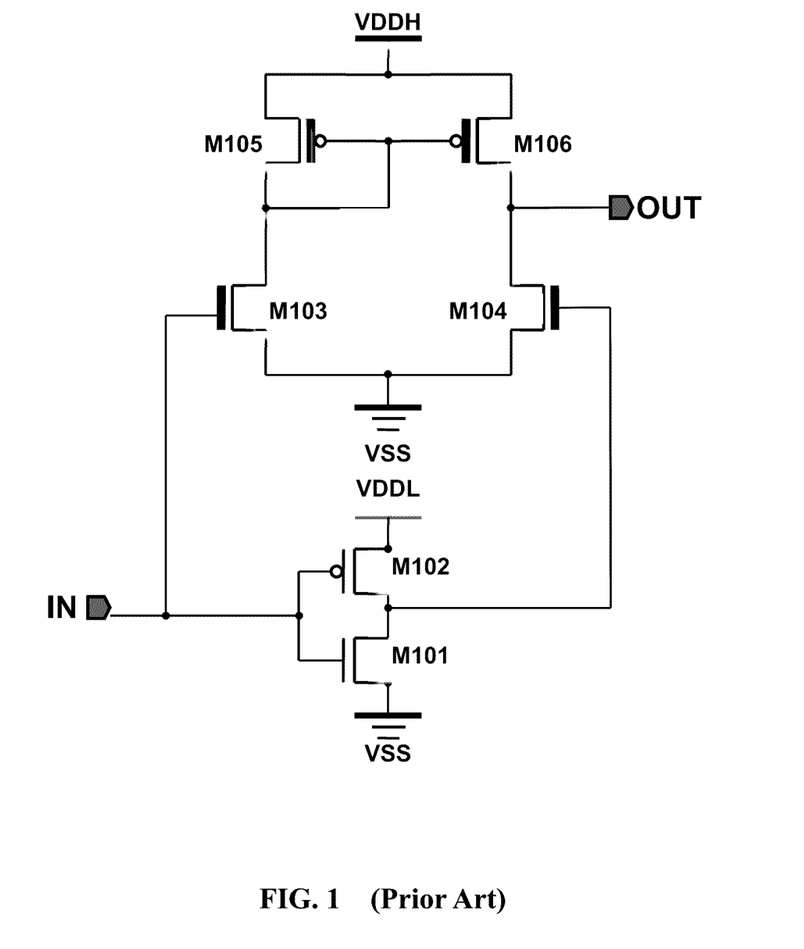
FIG. 1 is a circuit diagram of a conventional low-voltage to high-voltage shifter circuit.

FIG. 1 is a circuit diagram of a conventional voltage shifter circuit. As shown in FIG. 1, the voltage converter circuit includes transistors M101, M102, M103, M104, M105, and M106, in which transistors M101 and M102 may be thin gate oxide transistors, and transistor M103 and M104 may be thick gate oxide transistors.

As shown in FIG. 1, the current driving capability of transistors M105 and M106 are affected by the threshold voltage of each transistors, and they are not affected by the high-voltage power supply VDDH. In this way, a stable current driving capability can be maintained, suitable for a wide range of high-voltage power supply VDDH.

However, the inventor has observed that, in FIG. 1, when input IN is high, transistors M103 and M105 are open simultaneously, thus forming a path from the power supply to ground leakage current path. Since the transistors M103 and M104 are thick gate-oxide transistors having high threshold voltages, a conventional low-voltage to high-voltage shifter circuit, such as the one shown in FIG. 1, cannot be applied to ultra-low input signal voltages.

Figure 2:
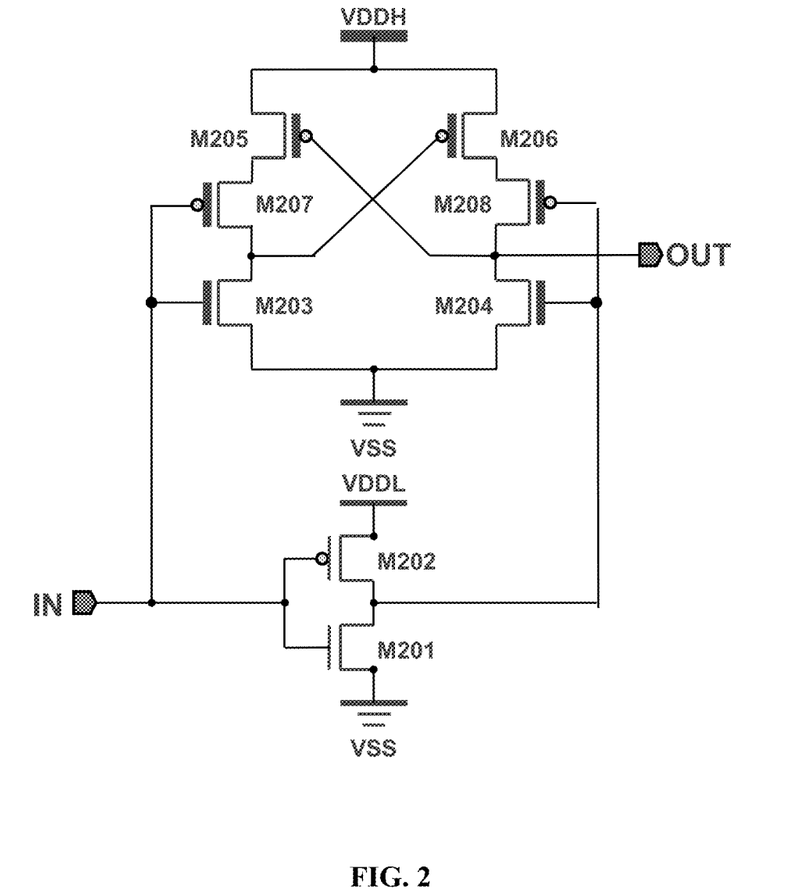
FIG. 2 is a circuit diagram of another conventional low-voltage to high-voltage shifter circuit.

FIG. 2 is a circuit diagram of another conventional low-voltage to high-voltage shifter circuit. As shown in FIG. 2, the voltage converter circuit includes transistors M201, M202, M203, M204, M205, and M206, in which transistors M201 and M202 are thin gate oxide transistors, and transistors M203 to M206 are thick gate oxide transistors. In the low-voltage to high-voltage shifter circuit in FIG. 2, thick gate-oxide PMOS transistors M207 and M208, along with thick gate oxide NMOS transistors M203 and M204, form an inverter and can quickly cut off the leakage current from the power supply to ground to improve the operating frequency.

However, the inventor has observed that the addition of thick gate-oxide MOS transistors M207 and M208 increases the minimum required power supply voltage VDDH. As a result, the low-voltage to high-voltage shifter circuit shown in FIG. 2 is not suited for wide output voltage applications.

In the meanwhile, with the enhancement of system performance, high speed becomes increasingly important. The inventor has also observed that conventional level shifter circuits often fail to meet the high speed requirements.

Therefore, an improved design of the low-voltage to high-voltage shifter circuit is highly desirable.

BRIEF SUMMARY OF THE INVENTION

In embodiments of the invention, a new voltage shifter circuit is provided for ultra-high speed, ultra-low input signal voltage, wide high-voltage range, and low DC operation current.

According to some embodiments of the present invention, a low-voltage to high-voltage level shifter circuit includes an input circuit, a voltage shifting circuit, and an output circuit. In some embodiments, the input circuit is configured to receive an input signal having a voltage range between a first voltage and a ground voltage, and to provide an inverted input signal and a delayed version of the inverted input signal. In some embodiments, the input circuit can be part of a logic circuit with a low-voltage power supply voltage VDDL and a ground voltage VSS. The voltage shifting circuit is coupled to the input circuit and is configured to receive the input signal, the inverted input signal, and the delayed version of the inverted input signal. Voltage shifting circuit 304 is configured to provide an internal signal having a voltage range between a second voltage and the ground voltage, the second voltage being higher than the first voltage. For example, the second voltage can be a high power supply voltage VDDH, and the ground voltage is VSS. The output circuit is coupled to the voltage shifting circuit and configured for receiving the internal voltage and to provide an output voltage having a voltage range between the second voltage and the ground. The low-voltage to high-voltage level shifter circuit is configured such that, if the input signal is at the first voltage, the output signal is at the second voltage, and if the input signal is at the ground voltage, the output signal is at the ground voltage. In other words, the low-voltage to high-voltage level shifter circuit receives a low-voltage signal and provides a corresponding output voltage in the high-voltage range.

In an embodiment, the input circuit includes an inverter circuit coupled to the input signal and configured to provide the inverted input signal, and a delay circuit coupled to the inverter circuit for providing the delayed version of the input signal.

In an embodiment, the voltage shifting circuit includes third, fourth, and fifth MOS transistors, each with a gate oxide of the first thickness, and sixth, seventh, eighth, and ninth MOS transistors, each with a gate oxide of the second thickness higher than the first thickness. The third, fifth, and eighth MOS transistors are coupled in series between the ground voltage and the second voltage. The fourth, seventh, and ninth MOS transistors are coupled in series between the ground voltage and the second voltage. The eighth and ninth MOS transistors are configured as a current mirror. The third and sixth MOS transistors are coupled to the input signal. The fourth and seventh MOS transistors are coupled to the inverted version of the input signal. The fifth transistor is coupled to the delayed version of the inverted input signal.

In an embodiment, the voltage shifting circuit also includes tenth, eleventh, and twelfth MOS transistors, each with a gate oxide of the second thickness higher than the first thickness. The eleventh and twelfth MOS transistors are coupled in series between the ground voltage and the second voltage. The gate terminals of the eleventh and twelfth MOS transistors are coupled to a first node between the seventh and ninth MOS transistors. A second node between the eleventh and twelfth MOS transistors is configured to provide the internal signal. A drain terminal of the tenth MOS transistor is coupled to the first node and a gate terminal of the tenth transistor is coupled to the second node to form a feedback path.

In an embodiment, the output circuit comprises thirteenth and fourteenth MOS transistors coupled in series between the ground voltage and the second voltage to form an inverter circuit, wherein gate terminals of the thirteenth and fourteenth MOS transistors are coupled to receive the internal voltage, and drain terminals of the thirteenth and fourteenth MOS transistors are coupled to provide the output voltage.

Depending on the embodiments, one or more of the following advantages can be achieved: robust performance with ultra-high operation frequency on GHz, ultra-low input signal voltage, wide high-voltage-power range, and reduced side effect of DC operation current. Using the combination of thin gate-oxide NMOS transistor and thick gate-oxide native NMOS transistor to receive the low-voltage input circuit enables the voltage shifter to work at ultra-low input signal voltage. The thin gate-oxide NMOS transistor also shows the robust performance on GHz ultra-high frequency. Using a combination of thick gate-oxide PMOS transistor and thick gate-oxide native NMOS transistor to replace the primary combination of thick gate-oxide PMOS transistor and thick gate-oxide NMOS transistor enables the voltage shifter to work at wide high-voltage-power range without degrading device reliability. Using a combination of an additional thin gate-oxide NMOS transistor and a delay element enables the voltage shifter to reduce the side effect of DC operation current. The connection of the gates of thin gate-oxide NMOS transistor and thick gate-oxide native NMOS transistor provides benefits to both the operation speed and leakage current.

The following description, together with the accompanying drawings, will provide further understanding of the nature and advantages of the claimed invention.

DETAILED DESCRIPTION OF THE INVENTION

Various embodiments of the present invention are described below. It should be noted that, when appropriate, the exemplary embodiments and features can be combined with each other.

Figure 3:
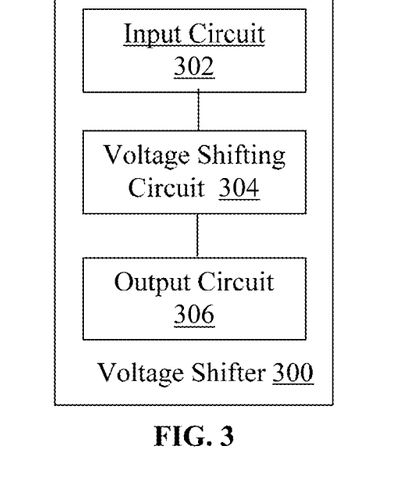
FIG. 3 is a block diagram of a low-voltage to high-voltage shifter circuit according to an embodiment of the present invention.

FIG. 3 is a block diagram of a low-voltage to high-voltage level shifter circuit according to an embodiment of the present invention. As shown in FIG. 3, a low-voltage to high-voltage level shifter circuit 300 includes an input circuit 302, a voltage shifting circuit 304, and an output circuit 306. In some embodiments, input circuit 302 is configured to receive an input signal having a voltage range between a first voltage and a ground voltage, and to provide an inverted input signal and a delayed version of the inverted input signal. In some embodiments, the input circuit can be part of a logic circuit with a low-voltage power supply voltage VDDL and a ground voltage VSS. Voltage shifting circuit 304 is coupled to the input circuit and is configured to receive the input signal, the inverted input signal, and the delayed version of the inverted input signal. Voltage shifting circuit 304 is configured to provide an internal signal having a voltage range between a second voltage and the ground voltage, the second voltage being higher than the first voltage. For example, the second voltage can be a high power supply voltage VDDH, and the ground voltage is VSS. Output circuit 306 is coupled to the voltage shifting circuit and configured for receiving the internal voltage and to provide an output voltage having a voltage range between the second voltage and the ground. The low-voltage to high-voltage level shifter circuit is configured such that, if the input signal is at the first voltage, the output signal is at the second voltage, and if the input signal is at the ground voltage, the output signal is at the ground voltage. In other words, the low-voltage to high-voltage level shifter circuit receives a low-voltage signal and provides a corresponding output voltage in the high-voltage range.

It is noted that the term low-voltage refers to the power supply voltage used in the core logic circuit, generally for high-speed and low-power applications, and the high-voltage refers to a higher power supply voltage for the circuits that require higher power, such as I/O circuits, interface circuits, etc. For example, low-voltage can mean 0.8-1.2 V or even lower voltage in some current technologies, and high-voltage can mean 1.5 V, 1.8 V, 2.5 V, or 3.3 V that may be needed in the I/O interface parts. On the other hand, in older technologies, low-voltage can mean 3.3 V and high-voltage can mean 5 V or 10 V. Therefore, the terms low-voltage and high-voltage are not to be restricted to certain specific voltage values. Similarly, the terms thin gate-oxide and thick gate-oxide refer to the relative gate oxide thickness for respective low and high power supply voltages. It is known in the art that the thickness of the gate oxide for an MOS transistor is determined by the breakdown voltage, leakage current, and reliability considerations for a given power supply voltage. For example, at 1.0 V core voltage, the gate oxide thickness can be 1.9 nm to 2.1 nm. In some technologies, the gate oxide thickness can be 1.2 nm to 1.6 nm, whereas at 3.3 V, the gate oxide thickness can be around 10 nm. In addition, high-K dielectrics can have a higher physical thickness, but provide the equivalently thinner electrical properties of a thinner gate oxide. Therefore, the terms thin gate-oxide and thick gate-oxide are also not to be restricted to certain specific voltage values. For example, in an example illustrated below in FIG. 5, low-voltage input has a range of 0.6 V~1.2 V, and the high-voltage output has voltage range of about 2.0~3.6 V.

Figure 4:
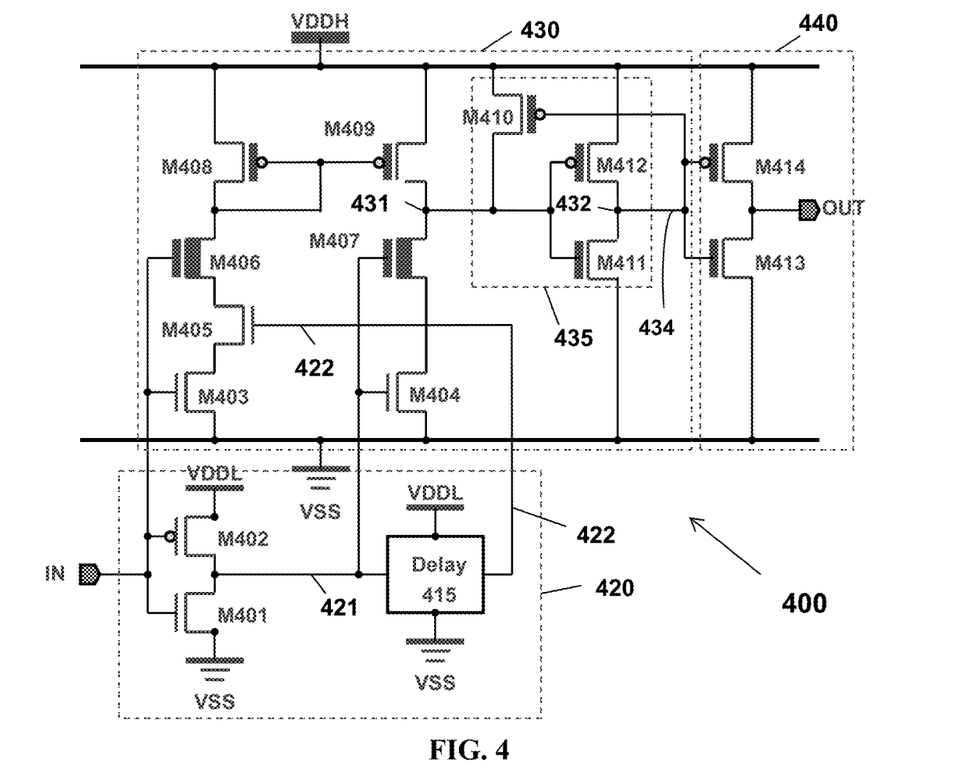
FIG. 4 is a circuit diagram of a low-voltage to high-voltage shifter circuit according to another embodiment of the present invention.

FIG. 4 is a circuit diagram of a low-voltage to high-voltage shifter circuit according to another embodiment of the present invention. As shown in FIG. 4, low-voltage to high-voltage shifter circuit 400 includes an input circuit 420, a voltage shifting circuit 430, and an output circuit 440. As shown, low-voltage to high-voltage shifter circuit 400 includes transistors M401, M402, M403, M404, M405, M406, M407, M408, M409, M410, M411, M412, M413, and M414 and a delay cell 415. Further, in FIG. 4, IN is the low-voltage input signal, and OUT is the high-voltage output signal. VSS is the ground voltage of the whole circuit, VDDL is the power supply voltage of the low-voltage circuit and the low-voltage input signal, also referred to as the first voltage, and VDDH is the power supply voltage of the high-voltage circuit and the high-voltage of output signal, also referred to as the second voltage.

As shown in FIG. 4, in some embodiments, input circuit 420 includes a plurality of MOS transistors, first MOS transistor M401 and second MOS transistor M402, each with a thin gate-oxide also referred to as the gate oxide of a first thickness. The voltage shifting circuit 430 includes a first plurality of MOS transistors, third MOS transistor M403, fourth MOS transistor M404, and fifth MOS transistor M405, each with a gate oxide of the first thickness, and a second plurality of MOS transistors, sixth MOS transistor M406, seventh MOS transistor M407, eighth MOS transistor M408, ninth MOS transistor M409, tenth MOS transistor M410, eleventh MOS transistor M411, and twelfth MOS transistor M412, each with a thick gate-oxide, also referred to as gate oxides of a second thickness that is higher than the first thickness. The output circuit 440 includes a plurality of MOS transistors, thirteenth MOS transistor M413 and fourteenth MOS transistor M414, each with a gate oxide of the second thickness. The gate oxide of the first thickness is configured to operate with the first voltage, and the gate oxide of the second thickness is configured to operate with the second voltage.

In some embodiments, input circuit 420 includes an inverter circuit (M401 and M402) coupled to the input signal IN and configured to provide the inverted input signal 421, and a delay circuit 415 coupled to the inverter circuit for providing a delayed version 422 of the input signal. The inverter circuit includes first MOS transistor and second MOS transistor coupled in series between the first voltage and the ground voltage, wherein gate terminals of the first and second MOS transistors are coupled to the input signal. In the embodiment of FIG. 4, first MOS transistor M401 is an NMOS transistor with a gate oxide of the first thickness, and second transistor M402 is a PMOS transistor with a gate oxide of the first thickness.

In FIG. 4, voltage shifting circuit 430 includes third, fourth, and fifth MOS transistors, M403, M404, and M405, each with a gate oxide of the first thickness, sixth, seventh, eighth, and ninth MOS transistors, M406, M407, M408, and M409, each with a gate oxide of the second thickness which is greater than the first thickness. As shown in FIG. 4, the third, fifth, and eighth MOS transistors are coupled in series between the ground voltage and the second voltage. The fourth, seventh, and ninth MOS transistors are coupled in series between the ground voltage and the second voltage. The eighth and ninth MOS transistors are configured as a current mirror. The third and sixth MOS transistors are coupled to the input signal. The fourth and seventh MOS transistors are coupled to the inverted version of the input signal. The fifth transistor is coupled to the delayed version of the inverted input signal.

Voltage shifting circuit 430 also includes tenth, eleventh, and twelfth MOS transistors, each with a gate oxide of the second thickness higher than the first thickness. The eleventh and twelfth MOS transistors are coupled in series between the ground voltage and the second voltage. The gate terminals of the eleventh and twelfth MOS transistors are coupled to a first node 431 between the seventh and ninth MOS transistors. A second node 432 between the eleventh and twelfth MOS transistors is configured to provide the internal signal 434. A drain terminal of the tenth MOS transistor M410 is coupled to the first node and a gate terminal of the tenth transistor is coupled to the second node to form a feedback path in a feedback circuit 435.

In voltage shifting circuit 430, the third, fourth, and fifth MOS transistors are NMOS transistors, each with a gate oxide of the first thickness. The sixth and seventh MOS transistors are native transistors, each with a gate oxide of the second thickness. The eighth, ninth, tenth, twelfth, and fourteenth MOS transistors are PMOS transistors, each with a gate oxide of the second thickness. The eleventh and twelfth MOS transistors are NMOS transistors, each with a gate oxide of the second thickness.

In FIG. 4, output circuit 440 includes the thirteenth and fourteenth MOS transistors (M413 and M414) coupled in series between the ground voltage and the second voltage to form an inverter circuit. The gate terminals of the thirteenth and fourteenth MOS transistors are coupled to receive the internal signal 434, and drain terminals of the thirteenth and fourteenth MOS transistors are coupled together to provide the output signal OUT.

As described above, in FIG. 4, low-voltage to high-voltage shifter circuit 400 includes transistors M401, M402, M403, M404, M405, M406, M407, M408, M409, M410, M411, M412, M413, and M414 and a delay cell 415. IN is the low-voltage input signal, and OUT is the high-voltage output signal. VSS is the ground of the whole circuit, VDDL is the power supply of the low-voltage input signal, and VDDH is the power supply of the high-voltage of output signal.

In an embodiment, transistors M401, M402, M403, M404, and M405 and the devices in delay cell 415 are all thin gate-oxide MOS transistors. Transistors M406 and M407 are both thick gate-oxide native NMOS transistors. As used herein, a native transistor is a transistor with nearly zero threshold voltage. In some embodiments, a native transistor can be formed without a threshold implant. Transistors M408, M409, M410, M411, M412, M413 and M414 are all thick gate-oxide MOS transistors. The source of M401 is connected to VSS. The source of M402 is connected to VDDL, both of their gates are connected together to IN, and both of their drains are connected together to the gates of M404 and M406 and the input net of delay cell. The sources of M408 and M409 are connected to VDDH, and both of their gates are connected together to the drain of M407. The sources of M403 and M404 are connected to VSS. The gates of M403 and M406 are connected together to IN. The drain of M403 is connected to the source of M405. The source of M406 is connected to the drain of M405. The drain of M406 is connected to the drain of M408. The gate of M405 is connected to the output net of the delay cell. The drain of M407 is connected to the drain of M409. The drains of M404 and M406 are connected together. The sources of M411 and M413 are connected to VSS. The sources of M412 and M414 are connected to VDDH. Both gates of M411 and M412 are connected together to the drain of M409. The drains of M411 and M412 and the gates of M413 and M414 are connected together. Both drains of M413 and M414 are connected together to OUT. The source of M410 is connected to VDDH, the drain of M410 is connected to the drain of M409, and the gate of M410 is connected to the drains of M411 and M412.

To achieve the ultra-high operation frequency on GHz and the ultra-low input signal voltage, thin gate-oxide MOS transistors of M401, M402, M403, M404, and M405, and the delay cell are applied for the low device threshold voltage, short device channel length, and small device parasitic capacitor.

To avoid the drain-source electrical overstress of M403, M404 and M405, thick gate-oxide native NMOS transistors of M406 and M407 are disposed in the voltage level shifting circuit, to protect and clamp the drains of M403, M404 and M405 to a voltage level no more than the input signal voltage VDDL.

To achieve the wide high-voltage-power range operation, the combination of thick gate-oxide PMOS transistor M408 and M409 and thick gate-oxide native NMOS transistor M406 and M407 are included the voltage level shifting circuit.

To reduce the DC operation current, the combination of M403, M404, M406, M407, M405, M401, and M402 and the delay cell are included. In case of IN switching from low to high, the signal will make M403 and M406 active, but will make M404 and M407 inactive. Meanwhile, M408 and M409 are also active on the signal edge, and active M408, M406 and M403 form a current path through VDDH to VSS. But low-voltage input signal IN actively forces a delayed inverted low-voltage signal through M401, M402 and the delay cell to the gate of M405. The delayed low-voltage signal actively forces M405 to inactive after the signal edge, to avoid DC current through M408, M406, M405 and M403 when the signal is stable after the delay provided by delay cell 415. The connection of the gates of M403 and M406, and M404 and M407 can contribute to higher operation speed and lower leakage current.

When IN is high, M406 is cut off by M401, M402 and delay cell 415. This cuts off the DC current path, and leaves the gates of M408 and M409 floating. Diode connected M408 will pull its gate (connected to its drain) to VDDH-Vt, and M408 and M409 will be weakly on. The leakage through drain-source of M407 and M404, and gate of M411 to VSS will pull the drain of M409 down away from VDDH. In this case, the feedback path provided by PMOS M410 latches the drain of M408 at VDDH. Thus, feedback circuit 435 provides the output voltage at high even though the DC current is reduced.

Figure 5:
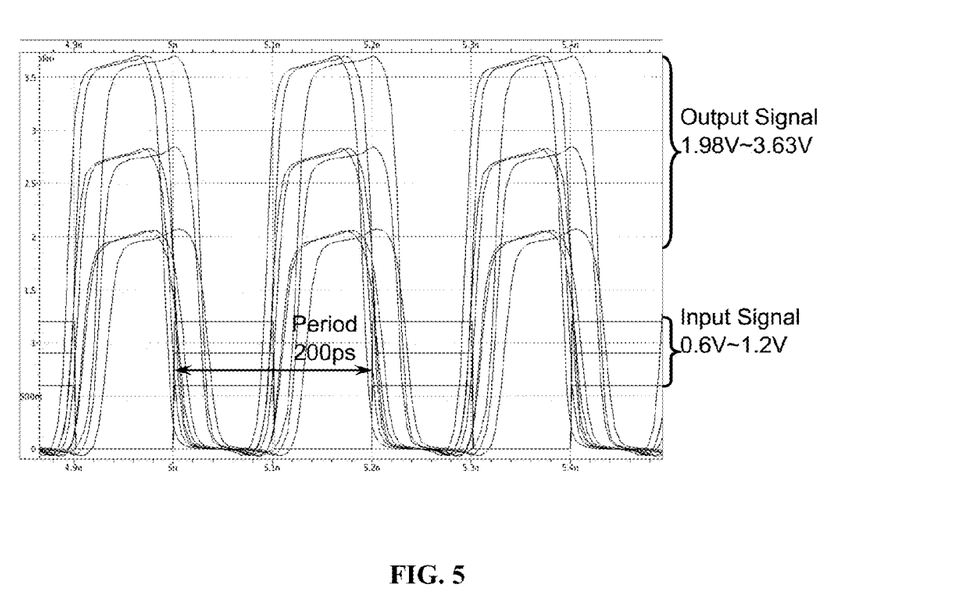
FIG. 5 is a waveform diagram illustrating the performance of a low-voltage to high-voltage shifter circuit according to an embodiment of the present invention.

FIG. 5 is a waveform diagram illustrating the performance of the low-voltage to high-voltage shifter circuit of FIG. 4 according to an embodiment of the present invention. In FIG. 5, the horizontal axis is the time at 0.02 ns intervals, and the vertical axis is the voltage at 100 mV intervals. Each cycle of the signal waveform shown in FIG. 5 is 200 ps. The parameters to generate results shown in FIG. 5 include: input and output signal frequency at 5 GHz to accommodate the signal frequency and high-frequency applications such as RF interface, an input supply voltage range of 0.6 V~1.2 V in order to accommodate the manufacturing process and application requirements for an increasingly lower voltage logic circuit, an output signal power supply voltage range of 1.98~3.63V to accommodate different application interface standards, a duty ratio of 48% to 51% in order to ensure that the digital signal transmission at high frequency boosts process signal integrity to meet the requirements of the lower circuit transmission delay of 80 ps~150 ps.

Those skilled in the art should understand that the above-described modules or steps of the embodiments may be designed using simulation in a general purpose computing device. The circuit components can be made into respective integrated circuit modules, or in a plurality of modules made into a single integrated circuit.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure.

What is claimed is:

1. A low-voltage to high-voltage level shifter circuit, comprising:
   an input circuit configured to receive an input signal having a voltage range between a first voltage and a ground voltage, and to provide an inverted input signal and a delayed version of the inverted input signal, the input circuit comprising a first MOS transistor and a second MOS transistor, each of the first and second MOS transistors with a gate oxide of a first thickness;
   a voltage shifting circuit coupled to the input circuit and configured to receive the input signal, the inverted input signal, and the delayed version of the inverted input signal and to provide an internal signal having a voltage range between a second voltage and the ground voltage, the second voltage being higher than the first voltage, the voltage shifting circuit comprising third, fourth, fifth, sixth, seventh, eighth, and ninth MOS transistors, each of the third, fourth, and fifth MOS transistors with a gate oxide of the first thickness; each of the sixth, seventh, eighth, and ninth MOS transistors with a gate oxide of a second thickness greater than the first thickness;
   an output circuit coupled to the voltage shifting circuit and configured for receiving the internal signal and to provide an output signal having a voltage range between the second voltage and the ground voltage;
   wherein:
   if the input signal is at the first voltage, the output signal is at the second voltage, and
   if the input signal is at the ground voltage, the output signal is at the ground voltage.

2. The circuit of claim 1, wherein the input circuit comprises:
   an inverter circuit coupled to the input signal and configured to provide the inverted input signal; and
   a delay circuit coupled to the inverter circuit for providing the delayed version of the input signal.

3. The circuit of claim 1, wherein the first and second MOS transistors are coupled in series between the first voltage and the ground voltage, wherein gate terminals of the first and second MOS transistors are coupled to the input signal.

4. The circuit of claim 1, wherein the first MOS transistor is an NMOS transistor with a gate terminal coupled to the input signal, the second transistor is a PMOS transistor a gate terminal coupled to the input signal, and the first and second MOS transistors are connected in series between the first voltage and the ground voltage forming an inverter to provide the inverted input signal.

5. The circuit of claim 1,
   wherein:
   the third, fifth, and eighth MOS transistors are coupled in series between the ground voltage and the second voltage;
   the fourth, seventh, and ninth MOS transistors are coupled in series between the ground voltage and the second voltage;
   the eighth and ninth MOS transistors are configured as a current mirror;

the third and sixth MOS transistors are coupled to the input signal;

the fourth and seventh MOS transistors are coupled to the inverted input signal; and the fifth transistor is coupled to the delayed version of the inverted input signal.

6. The circuit of claim 5, wherein the voltage shifting circuit further comprises:

tenth, eleventh, and twelfth MOS transistors, each with a gate oxide of the second thickness greater than the first thickness;

wherein:

the eleventh and twelfth MOS transistors are coupled in series between the ground voltage and the second voltage;

gate terminals of the eleventh and twelfth MOS transistors are coupled to a first node between the seventh and ninth MOS transistors;

a second node between the eleventh and twelfth MOS transistors is configured to provide the internal signal; and a drain terminal of the tenth MOS transistor is coupled to the first node and a gate terminal of the tenth transistor is coupled to the second node to form a feedback path.

7. The circuit of claim 6, wherein the gate oxide of the first thickness is configured to operate with the first voltage, and the gate oxide of the second thickness is configured to operate with the second voltage.

8. The circuit of claim 7, wherein:

the third, fourth, and fifth MOS transistors are NMOS transistors;

the sixth and seventh MOS transistors are native transistors;

the eighth, ninth, tenth, and twelfth MOS transistors are PMOS transistors, each of the eighth, ninth, tenth, and twelfth MOS transistors with a gate oxide of the second thickness; and the eleventh and twelfth MOS transistors are NMOS transistors, each of the eleventh and twelfth MOS transistors with a gate oxide of the second thickness.

9. The circuit of claim 1, wherein the output circuit comprises thirteenth and fourteenth MOS transistors coupled in series between the ground voltage and the second voltage to form an inverter circuit, wherein gate terminals of the thirteenth and fourteenth MOS transistors are coupled to receive the internal signal, and drain terminals of the thirteenth and fourteenth MOS transistors are coupled to provide the output voltage.

10. A low-voltage to high-voltage level shifter circuit, comprising:

an input circuit configured to receive an input signal having a voltage range between a first voltage and a ground voltage, and to provide an inverted input signal and a delayed version of the inverted input signal, the input circuit including a plurality of MOS transistors, each of the plurality of MOS transistors with a gate oxide of a first thickness;

a voltage shifting circuit coupled to the input circuit and configured to receive the input signal, the inverted input signal, and the delayed version of the inverted input signal and to provide an internal signal having a voltage range between a second voltage and the ground voltage, the second voltage being higher than the first voltage, the voltage shifting circuit including a first plurality of MOS transistors, each of the first plurality of MOS transistors with a gate oxide of the first thickness, and a second plurality of MOS transistors, each of the second plurality of MOS transistors with a gate oxide of a second thickness greater than the first thickness;

an output circuit coupled to the voltage shifting circuit and configured for receiving the internal signal and to provide an output signal having a voltage range between the second voltage and the ground, the output circuit including a plurality of MOS transistors, each with a gate oxide of the second thickness;

wherein:

if the input signal is at the first voltage, the output signal is at the second voltage, and if the input signal is at the ground voltage, the output signal is at the ground voltage.

11. The circuit of claim 10, wherein the input circuit comprises:

an inverter circuit coupled to the input signal and configured to provide the inverted input signal; and a delay circuit coupled to the inverter circuit for providing the delayed version of the input signal.

12. The circuit of claim 10, wherein the voltage shifting circuit comprises:

third, fourth, and fifth MOS transistors, each of the third, fourth, and fifth MOS transistors with a gate oxide of the first thickness;

sixth, seventh, eighth, and ninth MOS transistors each of the sixth, seventh, eighth, and ninth MOS transistors with a gate oxide of the second thickness higher than the first thickness;

wherein:

the third, fifth, and eighth MOS transistors are coupled in series between the ground voltage and the second voltage;

the fourth, seventh, and ninth MOS transistors are coupled in series between the ground voltage and the second voltage;

the eighth and ninth MOS transistors are configured as a current mirror;

the third and sixth MOS transistors are coupled to the input signal;

the fourth and seventh MOS transistors are coupled to the inverted version of the input signal; and the fifth transistor is coupled to the delayed version of the inverted input signal.

13. The circuit of claim 12, wherein the voltage shifting circuit further comprises:

tenth, eleventh, and twelfth MOS transistors, each of the tenth, eleventh, and twelfth MOS transistors with a gate oxide of the second thickness greater than the first thickness;

wherein:

the eleventh and twelfth MOS transistors are coupled in series between the ground voltage and the second voltage;

gate terminals of the eleventh and twelfth MOS transistors are coupled to a first node between the seventh and ninth MOS transistors;

a second node between the eleventh and twelfth MOS transistors is configured to provide the internal signal; and a drain terminal of the tenth MOS transistor is coupled to the first node and a gate terminal of the tenth transistor is coupled to the second node to form a feedback path.

14. The circuit of claim 10, wherein the output circuit comprises thirteenth and fourteenth MOS transistors coupled in series between the ground voltage and the second voltage to form an inverter circuit, wherein gate terminals of the thirteenth and fourteenth MOS transistors are coupled to receive the internal signal, and drain terminals of the thirteenth and fourteenth MOS transistors are coupled together to provide the output signal.

15. A low-voltage to high-voltage level shifter circuit, comprising:
   an input circuit configured to receive an input signal having a voltage range between a first voltage and a ground voltage, and to provide an inverted input signal and a delayed version of the inverted input signal, the input circuit comprising a first MOS transistor and a second MOS transistor;
   a voltage shifting circuit coupled to the input circuit and configured to receive the input signal, the inverted input signal, and the delayed version of the input signal and to provide an internal signal having a voltage range between a second voltage and the ground voltage, the second voltage being higher than the first voltage, the voltage shifting circuit comprising third, fourth, fifth, sixth, seventh, eighth, and ninth MOS transistors; and
   an output circuit coupled to the voltage shifting circuit and configured to receive the internal signal and to provide an output signal having a voltage range between the second voltage and the ground voltage,
   wherein the third, fifth, sixth and eighth MOS transistors are coupled in series between the ground voltage and the second voltage,
   wherein the fourth, seventh, and ninth MOS transistors are coupled in series between the ground voltage and the second voltage.

16. The circuit of claim 15, wherein the first, second, third, fourth, and fifth MOS transistors each have a gate oxide of the first thickness, and the sixth, seventh, eighth, and ninth MOS transistors each have a gate oxide of a second thickness that is greater than the first thickness.

17. The circuit of claim 16, wherein the sixth and the seventh MOS transistors are native transistors.

18. The circuit of claim 16, wherein the voltage shifting circuit further comprises:
   tenth, eleventh, and twelfth MOS transistors, each of the tenth, eleventh, and twelfth MOS transistors having a gate oxide of the second thickness, the eleventh and twelfth MOS transistors being coupled in series between the ground voltage and the second voltage;
   a first node between the seventh and ninth MOS transistors and coupled to gate terminals of the eleventh and twelfth MOS transistors;
   a second node between the eleventh and twelfth MOS transistors and configured to provide the internal signal; and
   the tenth MOS transistor coupled between the first node and the second voltage and having a gate terminal coupled to the second node.

19. The circuit of claim 18, wherein the output circuit comprises thirteenth and fourteenth MOS transistors coupled in series between the ground voltage and the second voltage to form an inverter circuit, wherein gate terminals of the thirteenth and fourteenth MOS transistors are coupled to the second node to receive the internal signal, and drain terminals of the thirteenth and fourteenth MOS transistors are coupled together to provide the output signal.

20. The circuit of claim 19, wherein the first, third, fourth, sixth, seventh, eleventh, thirteenth MOS transistors are NMOS transistors, and the second, eighth, ninth, tenth, twelfth, and fourteenth MOS transistors are PMOS transistors.

* * * * *